United States Patent
Chien et al.

(10) Patent No.: US 7,649,362 B2
(45) Date of Patent: Jan. 19, 2010

(54) APPARATUS FOR TESTING CATALYSIS ELECTRODE OF FUEL CELL

(75) Inventors: Chun-Ching Chien, Taipei (TW); Shean-Du Chiou, Taoyuan County (TW); Su-Hsine Lin, Taoyuan County (TW); Ning-Yih Hsu, Keelung (TW)

(73) Assignee: Atomic Energy Council, Lungtan Taoyuan (TW)

( * ) Notice: Subject to any disclaimer, the term of this patent is extended or adjusted under 35 U.S.C. 154(b) by 308 days.

(21) Appl. No.: 11/905,513

(22) Filed: Oct. 2, 2007

(65) Prior Publication Data
US 2009/0085580 A1    Apr. 2, 2009

(51) Int. Cl.
*H01M 4/00*    (2006.01)
*H01M 10/48*   (2006.01)
*G01N 27/26*   (2006.01)

(52) U.S. Cl. .................. 324/555; 429/40; 429/90; 204/400

(58) Field of Classification Search ................. 324/425, 324/439–450, 555; 429/12, 40, 90; 204/400
See application file for complete search history.

(56) References Cited

U.S. PATENT DOCUMENTS 6,611,151 B1 *  8/2003   Ruedisueli et al. .......... 324/700

* cited by examiner

*Primary Examiner*—Timothy J Dole
*Assistant Examiner*—Farhana Hoque
(74) *Attorney, Agent, or Firm*—Jackson IPG PLLC

(57) ABSTRACT

An apparatus is disclosed for testing a catalysis electrode of a fuel cell. The apparatus includes a driving module, a loading module, a containing module and an analyzing unit. The containing module includes a hollow threaded bolt, a sleeve and a contact plate. The hollow threaded bolt is operatively connected to driving module. The sleeve receives and is operatively connected to the hollow threaded bolt. The contact plate is located below the hollow threaded bolt in the sleeve. The analyzing unit includes a working electrode, an auxiliary electrode and a reference electrode. The working electrode is connected to the contact plate. The auxiliary electrode includes an end located below the containing module in the loading module. The reference electrode is connected to the loading module.

7 Claims, 5 Drawing Sheets

APPARATUS FOR TESTING CATALYSIS ELECTRODE OF FUEL CELL

BACKGROUND OF INVENTION

1. Field of Invention

The present invention relates to a fuel cell and, more particularly, to an apparatus for testing a catalysis electrode of a fuel cell.

2. Related Prior Art

In a conventional fuel cell, a membrane electrode assembly ("MEA") and gas diffusion electrode ("GDE") are made by bringing a catalyst into contact with carbon cloth or paper by spraying, knife coating, screening printing or plating. Only after the fuel cell is finished can the chemical properties of the MEA and the GDE be measured. Only then can it be learned whether the MEA and the GDE can be used in the fuel cell. This is however too late. A lot of material and time has already been wasted on the failed fuel cell.

The present invention is therefore intended to obviate or at least alleviate the problems encountered in prior art.

SUMMARY OF INVENTION

It is the primary objective of the present invention to provide an apparatus for testing a catalysis electrode of a fuel cell.

To achieve the primary objective of the present invention, an apparatus includes a driving module, a loading module, a containing module and an analyzing unit. The containing module includes a hollow threaded bolt, a sleeve and a contact plate. The hollow threaded bolt is operatively connected to driving module. The sleeve receives and is operatively connected to the hollow threaded bolt. The contact plate is located below the hollow threaded bolt in the sleeve. The analyzing unit includes a working electrode, an auxiliary electrode and a reference electrode. The working electrode is connected to the contact plate. The auxiliary electrode includes an end located below the containing module in the loading module. The reference electrode is connected to the loading module.

Other objectives, advantages and features of the present invention will become apparent from the following description referring to the attached drawings.

BRIEF DESCRIPTION OF DRAWINGS

The present invention will be described via detailed illustration of the preferred embodiment referring to the drawings.

DETAILED DESCRIPTION OF PREFERRED EMBODIMENT

Figure 1:
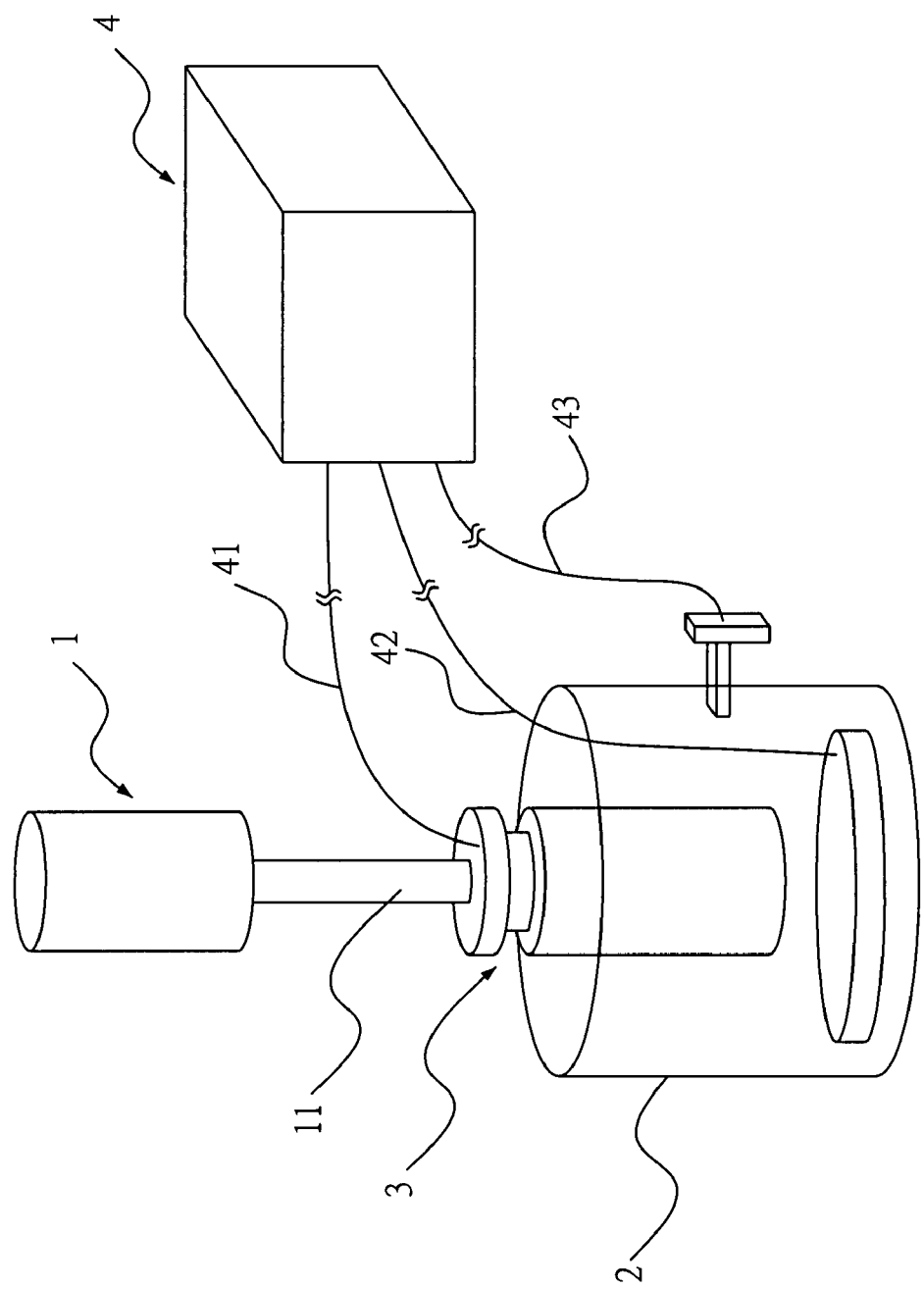
FIG. 1 is a perspective view of an apparatus for testing a catalysis electrode of a fuel cell according to the preferred embodiment of the present invention.
Figure 2:
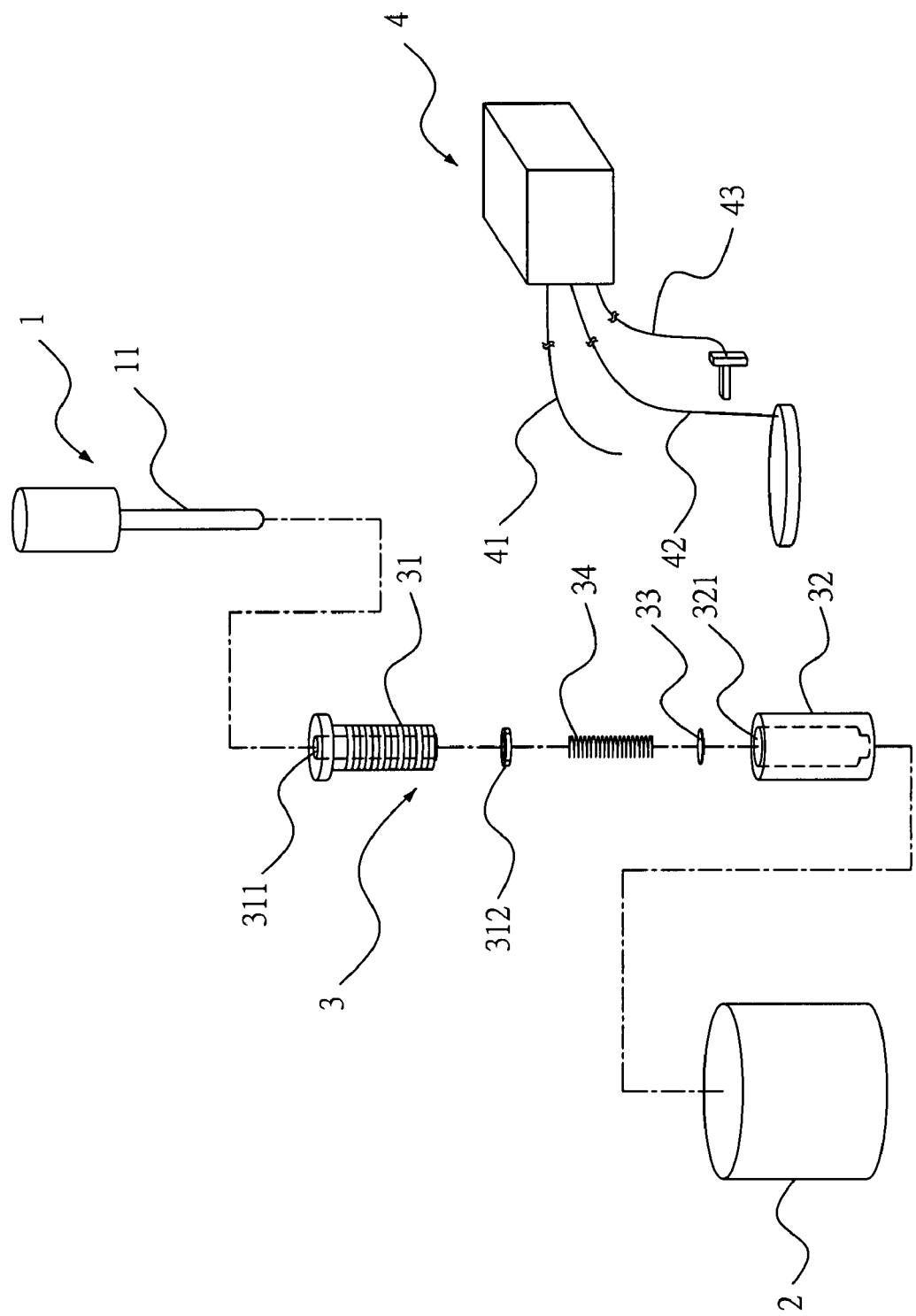
FIG. 2 is an exploded view of the apparatus shown in FIG. 1.
Figure 3:
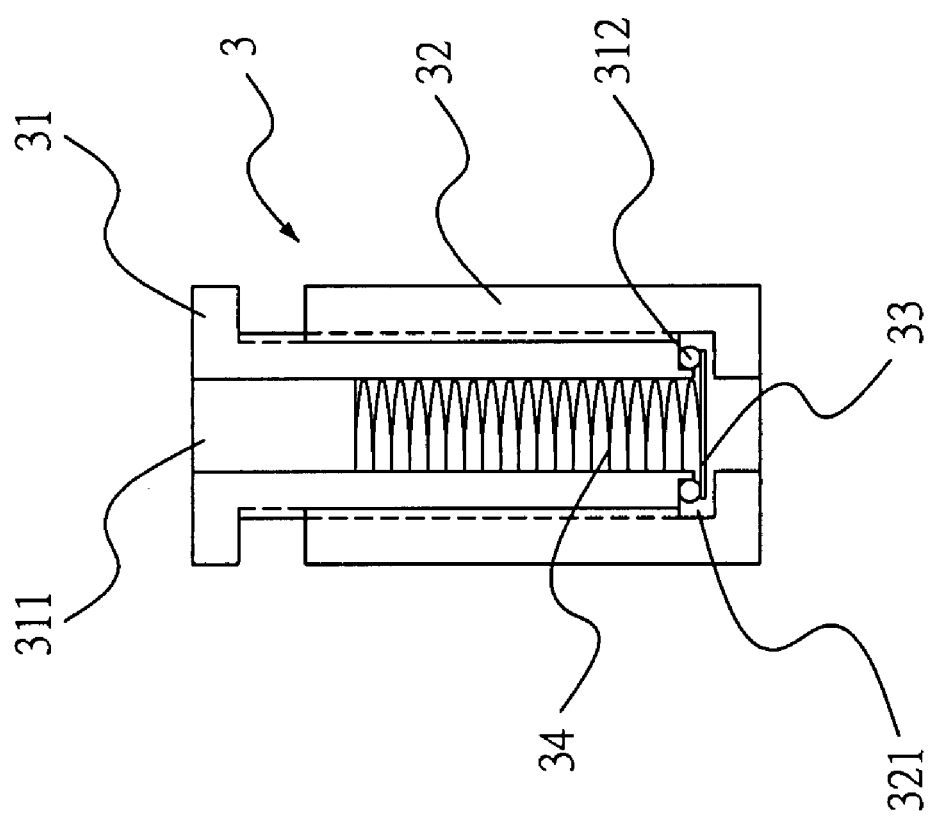
FIG. 3 is a cross-sectional view of a containing module of the apparatus shown in FIG. 1.

Referring to FIGS. 1 through 5, there is shown an apparatus for testing a catalysis electrode of a fuel cell according to the preferred embodiment of the present invention. The apparatus includes a driving module 1, a loading module 2, a containing module 3 and an analyzing unit 4. An MEA 5 for use in a fuel cell can be disposed in the containing module 3 and tested at a low cost and a high efficiency.

The driving module 1 includes an axle 11 extended from a motor for example.

The loading module 2 is substantially a tank.

The containing module 3 includes a hollow threaded bolt 31, a sleeve 32, a contact plate 33 and an elastic element 34. The hollow threaded bolt 31 includes tunnel 311 defined therein for receiving the axle 11 and the elastic element 34. The hollow threaded bolt 31 is operatively connected to the axle 11.

The sleeve 32 includes a tunnel 321 defined therein for receiving the hollow threaded bolt 31, the contact plate 33 and the washer 312. The wall of the tunnel 321 of the sleeve 32 is formed with a thread for engagement with the thread of the hollow threaded bolt 31. The contact plate 33 is made of gold for example.

The analyzing unit 4 includes a working electrode 41, an auxiliary electrode 42 and a reference electrode 43. The working electrode 41 is inserted through the elastic element 32 in the hollow threaded bolt 31. The auxiliary electrode 42 includes a flat end located below the containing module 3 in the loading module 2. The reference electrode 43 includes an end attached to an internal or external side of the loading module 2.

Figure 4:
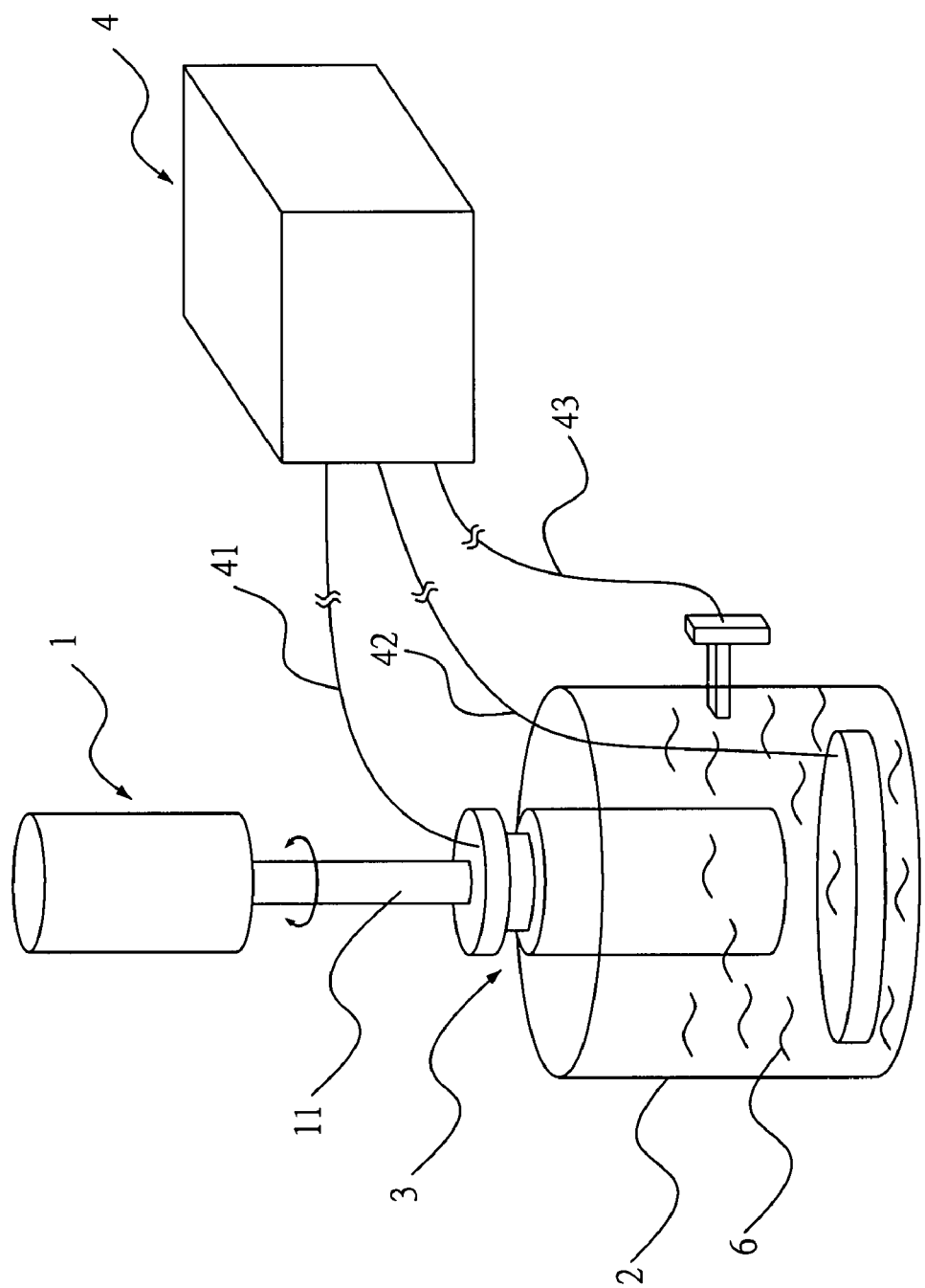
FIG. 4 is a perspective view of working liquid filled in a loading module of the apparatus shown in FIG. 1.
Figure 5:
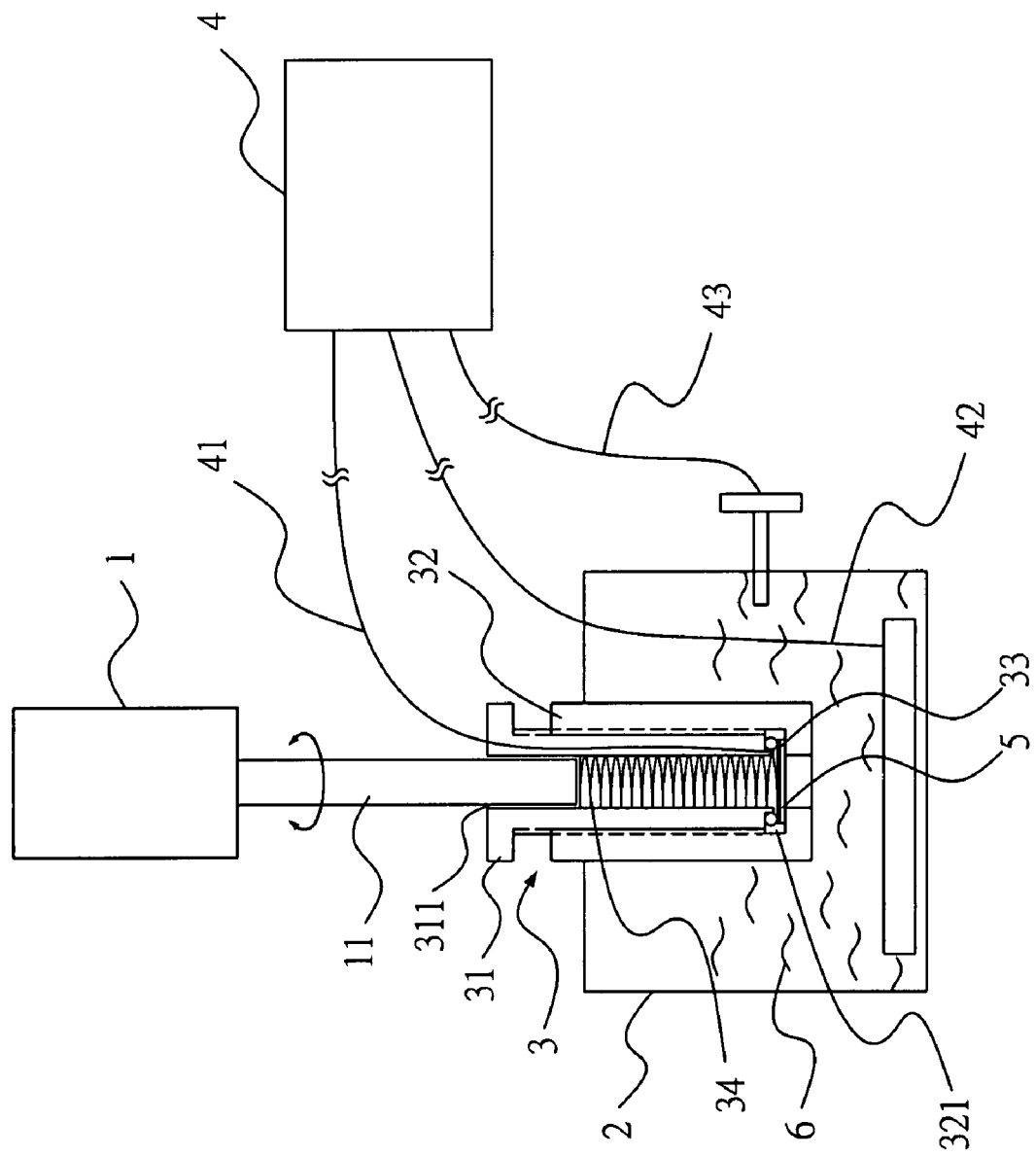
FIG. 5 is a cross-sectional view of a to-be-tested object disposed in the containing module of the apparatus shown in FIG. 4.

Referring to FIGS. 4 and 5, the MEA 5, the contact plate 33 and the washer 312 are subsequently disposed in the sleeve 32. The thread of the hollow threaded bolt 31 is engaged with the thread of the sleeve 32 so that a lower end of the hollow threaded bolt 31 is abutted against the washer 312. The elastic element 34 is disposed in the hollow threaded bolt 31 so that a lower end of the elastic element 34 is abutted against the contact plate 33. The axle 11 is inserted in the hollow threaded bolt 31 so that a free end of the axle 11 is abutted against an upper end of the elastic element 34. A free end of the working electrode 41 is connected to the contact plate 33. The flat end of the auxiliary electrode 42 is located below the sleeve 32. Working liquid is filled in the loading module 2.

In the test of the MEA 5, the driving module 1 drives the containing module 3 that in turn rotates the MEA 5. The working electrode 41, the auxiliary electrode 42, the reference electrode 43 and the working liquid 6 are used to measure chemical properties of the MEA 5 according to cyclic voltammetry or electrochemical impedance spectroscopy.

As discussed, before the MEA 5 is used in the fuel cell, the MEA 5 is tested at a low cost and a high efficiency. The cost of the fuel cell is therefore low.

The present invention has been described via the detailed illustration of the preferred embodiment. Those skilled in the art can derive variations from the preferred embodiment without departing from the scope of the present invention. Therefore, the preferred embodiment shall not limit the scope of the present invention defined in the claims.

The claimed is:

1. An apparatus for testing a catalysis electrode of a fuel cell, the apparatus comprising:
   a driving module;
   a loading module;
   a containing module comprising:
      a hollow threaded bolt operatively connected to driving module;
      a sleeve for receiving and operative connecting to the hollow threaded bolt; and a contact plate located below the hollow threaded bolt in the sleeve; and an analyzing unit comprising:

a working electrode connected to the contact plate;

an auxiliary electrode comprising an end located below the containing module in the loading module; and a reference electrode connected to the loading module.

2. The apparatus according to claim 1, wherein the driving module comprises an axle inserted in and operatively connected to the hollow threaded bolt.

3. The apparatus according to claim 2, wherein the containing module comprises an elastic element between the contact plate and the axle.

4. The apparatus according to claim 2, wherein the containing module comprises a washer between the contact plate and the hollow threaded bolt.

5. The apparatus according to claim 1, wherein the contact plate is made of gold.

6. The apparatus according to claim 1, wherein the end of the reference electrode is attached to an external side of the loading module.

7. The apparatus according to claim 1, wherein the end of the reference electrode is attached to an internal side of the loading module.

* * * * *